Sept. 25, 1951 W. T. BROWN ET AL 2,568,715

ADJUSTABLE ELECTRICAL CONDENSER MOUNTING MEANS

Filed Oct. 25, 1945

INVENTORS
WILLIAM T. BROWN
LAMAR C. GIRARDOT

BY [signature]

ATTORNEY

Patented Sept. 25, 1951 2,568,715

UNITED STATES PATENT OFFICE 2,568,715

ADJUSTABLE ELECTRICAL CONDENSER MOUNTING MEANS

William T. Brown, Fort Wayne, and La Mar C. Girardot, New Haven, Ind., assignors, by mesne assignments, to Farnsworth Research Corporation, a corporation of Indiana Application October 25, 1945, Serial No. 624,356

3 Claims. (Cl. 74—424.8)

This invention relates generally to components for electrical equipment and in particular it is concerned with a novel electrical condenser assembly especially suited to use in high frequency carrier current signalling apparatus.

For many purposes such as in television systems, the intelligence signals which are used to modulate a carrier are in themselves of a relatively high order of frequency magnitude and cover a frequency band of considerable width. For example, television video signals cover a band which is from four to four and one-half megacycles in width. A carrier wave which is to be modulated with intelligence signals of this character of necessity then must be of the order of 40 megacycles or more.

In order for such signaling systems to operate satisfactorily and at maximum efficiency it is necessary that the vacuum tube circuits and the auxiliary components utilized therein be of a character capable of operating efficiently at relatively high frequencies. The auxiliary components employed in vacuum tube circuits very often limit the frequencies at which the apparatus may be operated. Furthermore, the nature and arrangement of these circuit components relative to one another has a material bearing on the operating frequency and also determines to a great extent the width of the frequency band which may be passed by the apparatus.

In many types of vacuum tube circuits such as frequency multipliers, power amplifiers and the like it is customary to utilize neutralizing condensers for cross-coupling the plate and grid circuits of a pair of vacuum tubes connected in push-pull arrangment to prevent the apparatus from oscillating. In such a circuit structure the usual practice is to connect to the grids of the tubes and also to the plates thereof respective resonant circuits each comprising an inductance and a capacitance element connected in parallel so as to produce a circuit which is tuned for resonance at the desired operating frequency. The neutralizing condensers then usually are components which are mounted on the tube chassis and wired to the appropriate tube electrodes. Such arrangements operate quite successfully at relatively low frequencies but at the relatively high frequencies required for such as television systems the operation is not at maximum efficiency. The same thing is true of course of the condensers used to tune the inductive devices in the resonant circuits of the apparatus. It, therefore, is desirable to mount the reactive elements such as condensers and inductors as close to the terminals of the tube elements as possible.

Additionally, in apparatus of this character it is necessary that the condensers, for example, be accessible for easy adjustment. Such adjustments are required in lining up the apparatus for operation so as to tune the inductive elements for resonance at the desired frequency and also, in the case of neutralizing condensers, to effect the maximum neutralization of the interelectrode tube capacitances. Such adjustments also frequently are required from time to time during the operation of the apparatus to compensate for changing conditions. A desirable feature of any adjusting mechanism for varying the capacity of a condenser is that it be susceptible of operation with a maximum of ease. Also, it is generally necessary that the condenser remain fixed in whatever adjusted position it is set. Mechanism for meeting this latter requirement usually cannot be incorporated in apparatus which is designed to provide the easy adjustment feature. Where the apparatus is used in equipment which may be subject to vibration or other mechanical shock it is imperatve that the condenser mechanism be secured effectively in its adjusted position.

It, therefore, is an object of this invention to provide a novel mounting structure for a movable element such as a condenser plate which will enable easy adjustment of the movable element and at the same time provide a support therefor which will hold it securely against vibration in whatever position it is set.

In accordance with the present invention electrical condensers particularly suited to use in high frequency carrier current signalling apparatus are provided with a mounting structure to enable an adjustment to be made in the spacing of associated plates of the condensers whereby to vary the capacity thereof. The mounting structure provided for the condenser plates in accordance with this invention is susceptible of use with other movable members which require adjustment. Broadly, the mounting structure includes a stud extending from the movable member, a stationary mounting member and a movable mounting member. There are provided passageways through the mounting members for the stud and also a retaining means for limiting endwise sliding movement of the stud through the passageways. In addition, there is provided resilient means effectively engaging the movable mounting member and tending to effect sliding movement of the movable mounting member on the stud relative to the stationary mounting member; but such sliding movement is prevented by the retaining means. However, the stud is adapted for rotative movement in the mounting members so that a movement of the movable member may be effected. By reason of the frictional engagement of the movable mounting member by the retaining means, there is provided a mounting structure which will enable quick and easy adjustment of the movable member and at the same time hold the movable member securely against vibration in whatever adjusted position it is set without the employment of set screws or other locking devices of this character.

Specifically, in accordance with a preferred illustrative embodiment of the invention, each of the condenser plates which is arranged for adjustment is provided with a stud in the form of a threaded rod extending therefrom. The mounting structure comprises a two-part member, each part of which is provided with a threaded hole for engagement by the rod extending from the condenser plate. A resilient device such as a compression spring is secured to the two parts of the mounting structure and is maintained in a compressed state between these two parts by reason of the engagement of the respective threaded holes thereof by the threaded condenser rods. The resilient device such as the spring tends to move the two parts of the mounting member in opposite directions along the axis of the threaded rod but is prevented therefrom by reason of the threaded engagement of the rod and the holes in the two-part structure. In this manner there is exerted, under the influence of the spring, an endwise thrust in opposite directions on the condenser plate rod which operates to prevent a change in the position of the condenser plate. Additionally, there may be provided, if desired, a facility for keying the two parts of the mounting member together in a manner to prevent relative rotative movement thereof.

For a better understanding of the invention, together with other and further objects thereof, reference is had to the following description, taken in connection with the accompanying drawings, and its scope will be pointed out in the appended claims.

Figure 1:
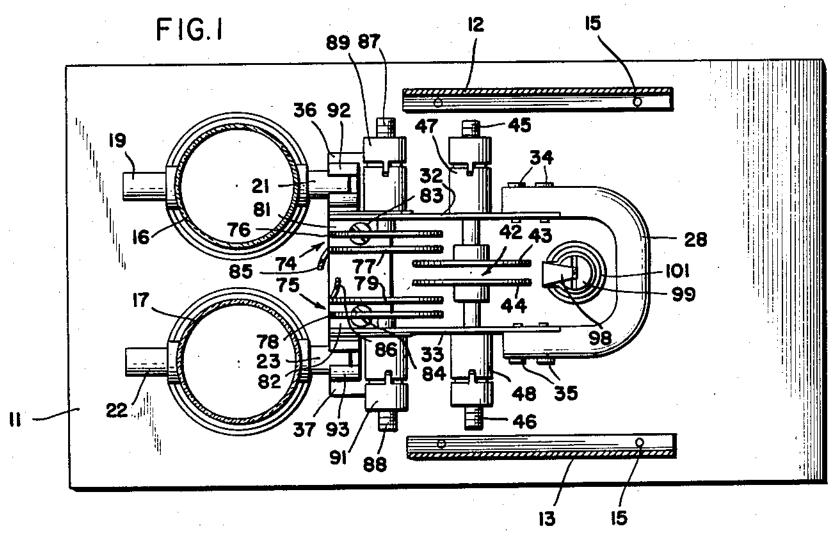
Fig. 1 is substantially a top plan view, partially in section, of a portion of a push-pull power amplifier comprising condensers embodying the principles of this invention.
Figure 2:
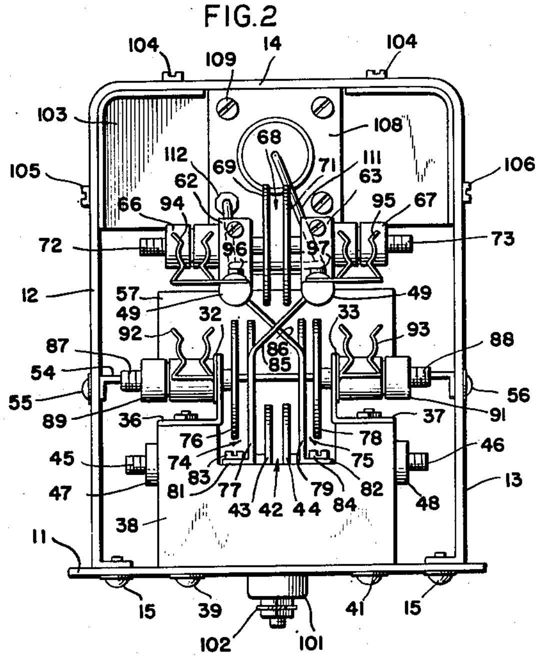
Fig. 2 is substantially an end view, of the device illustrated in Fig. 1 but with the vacuum tube omitted for clearance of illustration of other parts of the equipment.

Reference now will be made to the drawings for a detailed description of one type of apparatus embodying the invention. For illustrative purposes the novel adjustable condenser plate mounting structure according to this invention is shown as a part of a power amplifier designed to work at a relatively high frequency of the order of 40 or more megacycles covering a frequency band of four to four and one-half megacycles in width. Referring now particularly to Figs. 1 and 2 of the drawings it will be noted that there is illustrated an apparatus mounted on a chassis comprising a base plate 11 and a superstructure attached thereto. The superstructure comprises two sides 12 and 13 and a top 14. The lower end of each of the sides is bent inwardly for attachment to the base plate by means of a plurality of screws such as 15. The power amplifier also includes a pair of vacuum tubes 16 and 17, the respective bases of which are mounted in sockets supported by, and extending through to the underside of, the base plate 11. The tubes used in this particular apparatus are RCA type 8025 and consist essentially of an indirectly heated cathode, a control grid and an anode. The connections to the cathode and the heater element thereof are made through the base of the tube. The control grids of the tubes are connected through the respective tube envelopes to cap terminals 19, 21 and 22, 23 mounted on opposite sides of the respective envelopes. Similarly, the anodes of the tubes are connected to other cap terminals. In this manner multiple connections may be made to the grid and plate electrodes of the tubes.

The resonant circuit structure for the grid circuits of the tubes 16 and 17 includes a short transmission line 28, which in this case is U-shaped, supported at the closed end thereof by an insulator 29 attached to the base plate 11 by a screw 31. Two connector arms 32 and 33 are attached to the respective open ends of the line 28 by means of screws 34 and 35. Each of the arms has an approximate Z configuration and is provided on the respective outer ends of each of the arms 32 and 33 with mounting lugs 36 and 37. The character of these mounting lugs is best illustrated in Fig. 2. These lugs are supported by an insulating block 38 which is attached to the base plate 11. The insulating block and the lugs 36 and 37 are secured by bolts 39 and 41 respectively which extend through the base plate, the insulating block and the respective lugs. A tuning condenser 42 consisting of two circular spaced parallel plates 43 and 44 is connected to the open ends of the transmission line 28. The condenser plates have extending therefrom threaded rods 45 and 46 respectively. These rods are threaded through adjustable mounting supports 47 and 48 respectively, which are attached to the respective connector arms 32 and 33. The condenser plate mounting supports constitute one embodiment of the instant invention and will be described subsequently in greater detail.

The plate circuits of the tubes 16 and 17 also are provided with a resonant circuit structure including a short transmission line 49 which also may be U-shaped, as shown. The closed end of the transmission line 49 is provided with a depending supporting and connector rod which extends through a two-part insulating bushing and is secured thereto by means of a nut adapted for engagement with a threaded end portion of the rod. The bushing is mounted in a shelf 54 which extends laterally across the chassis superstructure between the upstanding sides 12 and 13 thereof and is attached to the sides by means of a plurality of screws 55 and 56. The shelf acts as a shield and prevents inductive coupling between the grid and plate transmission lines 28 and 49. An insulating block 57 is attached by means of screws to the shelf 54 at the forward end thereof. The block 57 is grooved to receive the two legs of the transmission line 49 which are supported by the block and are attached thereto by screws. There are formed integrally with the legs of the transmission line 49 two split brackets 62 and 63. These brackets are adapted to be closed sufficiently by means of screws to securely clamp therein adjustable mounting supports 66 and 67, respectively. A tuning condenser 68 for the plate transmission line 49 consists of a pair of circular spaced parallel plates 69 and 71. These plates are provided with extending threaded rods 72 and 73, respectively, for engagement with the respective supporting devices 66 and 67 whereby to mount the plates of the tuning condenser 68.

The apparatus also comprises two neutralizing condensers 74 and 75 which consist respectively of spaced parallel plates 76, 77 and 78, 79. The neutralizing condenser plates 77 and 79 are stationary and are provided at the respective lower sides thereof with annular mounting lugs 81 and 82 which are arranged to be securely attached to a recessed portion of the mounting block 38 by means of screws 83 and 84, respectively. The two stationary neutralizing condenser plates also are provided with cross connections 85 and 86. These connections may be stamped out of the same piece of metal of which the stationary condenser plates are formed and welded, soldered or otherwise mechanically and electrically connected to the respective open ends of the plate transmission line 49 substantially in the manner shown in Fig. 2. The movable neutralizing condenser plates 76 and 78 are provided with extending threaded rods 87 and 88 for engagement with respective adjustable mounting devices 89 and 91. The mounting devices 89 and 91 are attached respectively to the connector arms 32 and 33.

Spring clips 92 and 93 also are securely attached to the arms 32 and 33. There also are provided spring clips 94 and 95 which are formed with lugs for insertion in suitable mounting slots formed in the open ends of the plate transmission 49 and rigidly secured thereto by screws 96 and 97.

The grid transmission line 28 is connected to the grounded base plate 11 by means of a screw. The plate transmission line 49 is connected by means of a rod and a conductor 98 to a terminal formed by a screw 99 extending through a two-part insulating bushing 101 which is mounted in the base plate 11. A connection 102 may be made from the terminal 99 to any desired source of power.

In addition, there is provided a mounting plate 103 at the back of the chassis superstructure immediately below the top 14 and extending between the sides 12 and 13. This plate is attached to the top 14 by means of a plurality of screws such as 104 and also is secured to the sides 12 and 13 by screws such as 105 and 106. There is formed a circular hole in the central portion of the plate 103 in which there is mounted a terminal plug held in position in the opening by a small retaining plate 108 which is attached to the mounting plate 103 by means of a plurality of screws such as 109. A small output loop 111 is mounted so that a portion thereof is inductively coupled to the plate transmission line 49. One end of the loop 111 is connected to the grounded mounting plate 103 by means of a plurality of nuts 112. The other end of the output loop is connected to the center terminal of the plug.

When the tubes 16 and 17 are inserted in their respective sockets the two anode terminal caps are engaged with the respective spring clips 94 and 95. In like manner, the two grid terminal caps 21 and 23 are inserted in the respective spring clips 92 and 93. By means of this arrangement it is seen that the appropriate connections are made to the grid and plate tuned circuits of the apparatus. Also, it may be seen more clearly by particular reference to Fig. 2 that the neutralizing condenser 74 is coupled between the grid circuit of the tube 16 and the plate circuit of the tube 17. Similarly, the neutralizing condenser 75 may be seen to be coupled between the grid circuit of the tube 17 and the plate circuit of the tube 16. Energy may be derived from the apparatus by making a suitable connection to the terminal plug.

Figure 3:
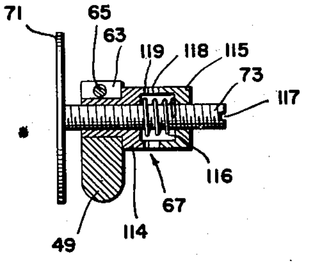
Fig. 3 is a detailed sectional view of a portion of the device illustrated in Figs. 1 and 2 showing details of a preferred form of the novel adjustable plate mounting structure in accordance with this invention.

Reference will now be made to Fig. 3 which shows in cross section the details of one of the mountings for a movable element such as one of the adjustable condenser plates and which embodies the subject matter of this invention in a preferred form. The mounting 67 is a two-part structure, including a mounting block 114 and a retaining cup 115. Threaded holes are formed through these pieces for engagement with the threaded rod 73. The mounting block 114, if desired, may be turned down on one end to form a reduced section which is securely held in the clamp 63 by tightening the screw 65. The member 115 has a recess of considerable depth formed therein so as to give the piece a cup shape. A helical compression spring 116 is compressed between the mounting block 114 and the retaining cup 115. The rod 73 is threaded through the two mounting pieces and the spring so that the threaded engagement of the parts maintains the spring in its compressed state.

By means of this structural arrangement the compression spring tends to separate the mounting block and the retaining cup but is prevented from doing so by the threaded engagement of these members with the rod 73. Nevertheless, the thrust exerted by the spring in opposite directions along the axis of the rod 73 produces pressure in opposite directions upon the threads of the rod by means of the two parts of the mounting structure. These pressures are sufficient to inhibit turning of the rod in the threaded holes under the influence of vibration or other mechanical shock. As a result, the condenser plate 71 is held securely in any desired adjusted position.

The end of the rod 73 is provided with a slot 117 for engagement by a screw driver so that the rod may be threaded into or out of the mounting device and thereby be adjustably moved relative to the companion plate of the condenser. Such a structure enables easy adjustment of the condenser plate spacing and provides a facility which will maintain the condenser plate accurately in its adjusted position.

If desired, the mounting block 114 and the retaining cup 115 may be keyed together so as to prevent mutual relative rotative movement. The retaining cup, for example, may be provided with one or more projections such as 118, for engagement with cooperating slots such as 119, formed in the mounting block 114.

Figure 5:
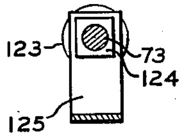
Fig. 5 is a sectional view of Fig. 4 taken along the line 5—5.
Figure 4:
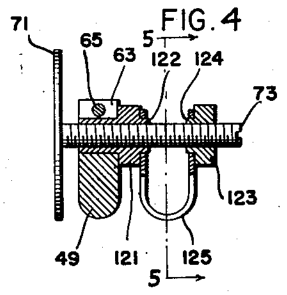
Fig. 4 is a sectional view similar to Fig. 5 of a modified form of condenser plate mounting structure.

A modification of a mounting structure for a movable element such as an adjustable condenser plate in accordance with this invention is shown in Figs. 4 and 5 to which reference now will be made. A mounting block 121 is provided with a threaded hole extending therethrough but, instead of being recessed as in the preferred form of the invention, it is provided with a boss 122. Similarly, retaining block 123 has a threaded hole formed therethrough and also is provided with a boss 124 facing the mounting block boss. The compression spring in this case consists of a relatively short length of flat spring strap material 125 which may be bent to have a substantial U-shape as illustrated in the drawing. The spring 125 has holes formed therein adjacent the ends thereof to receive the respective bosses 122 and 124. The rod 73 is threaded through the mounting block and the retaining member, as in the preferred form of the invention, so as to maintain the spring 125 in a compressed state.

If it is desired to insure that the threaded members 121 and 123 will not rotate on the rod 73 relative to one another they may be keyed together in any conventional manner. A convenient arrangement for this purpose is to form flat sides on the pieces 122 and 124 and corresponding flat sides in the cooperating holes of the compression spring 125 as illustrated in Fig. 5. In this case then the compression spring itself is instrumental in preventing mutual rotative movement of the mounting members 121 and 123.

The principle underlying the invention embodied in the hereinabove described adjustable condenser plate mountings is the use of two members having threaded holes formed therein for engagement with different portions of a threaded rod and wherein a resilient device is employed to urge the two members in opposite directions along the axis of the threaded rod. In the two illustrative embodiments shown in Figs. 3 and 4 the resilient member consists of a compression spring whereby to tend to separate the two members. Obviously, it is within the scope of the invention to employ resilient means other than metallic springs. Furthermore, it is within the purview of the invention to utilize resilient means which tend to move the two members toward one another. For example, in Fig. 3 the spring 116 could be a tension spring with the ends thereof suitably attached to the tapped members 114 and 115 so as to exert an inward pressure upon these two members.

Likewise, the novel mounting structure in accordance with this invention is not limited to the particular condenser apparatus chosen for illustration. A different type of condenser plate or plates, ganged together mechanically in a well known manner wherein the plate or plates consist of only segments of a circular area, may be mounted in a structure such as that described. In such a case the capacity of the condenser may be varied by rotating the plate or plates relative to a stator plate assembly. Moreover, the threaded rod used in a structure in accordance with the present invention need not be attached to a condenser plate. Instead, it may be attached to a sliding contact of a variable resistor or the like. In fact, the novel mounting structure may be employed to advantage with any type of a movable element which it is desired to adjust either by moving the element axially of the attached threaded rod or angularly relative to the rod.

While there have been described what are considered illustrative embodiments of the invention, it will be obvious to those skilled in the art that various other changes and modifications may be made therein without departing from the invention, and therefore, it is aimed in the appended claims to cover all such changes and modifications as fall within the true spirit and scope of the invention.

What is claimed is:

1. In an electrical condenser assembly including a condenser plate having a threaded rod extending from one face thereof, a supporting structure therefor comprising, a mounting block support having a threaded hole for engagement with one portion of said threaded rod, a retaining cup support having a threaded hole for engagement with another portion of said threaded rod, a notched keyway in one end of one of said supports, a key projecting from one end of the other of said supports for engagement with said keyway and a compression spring retained in a compressed state between said cup and said mounting block, said spring tending to separate said retaining cup and said mounting block but being prevented therefrom by the engagement of said threaded rod with the respective threaded holes in said mounting block and said retaining cup, said rod being adapted for threading movement through said threaded holes, and the engagement of said key with said keyway preventing relative rotation of said cup and said mounting block by said rod threading movement.

2. In an electrical condenser assembly including a condenser plate having a threaded rod extending from one face thereof, a supporting structure therefor comprising, a mounting block having a threaded hole for engagement with one portion of said threaded rod and also having a recess formed in one end thereof surrounding said threaded hole, said mounting block additionally being provided with a keyway in said one end at the outer edge of said recess, a retaining cup having a threaded hole for engagement with another portion of said threaded rod and also having a key projecting therefrom for engagement of said mounting block keyway, and a helical compression spring surrounding said threaded rod and retained in a compressed state by said cup and the recessed portion of said mounting block, said spring tending to separate said retaining cup and said mounting block but being prevented therefrom by the engagement of said threaded rod with the respective threaded holes in said mounting block and said retaining cup, said rod being adapted for threading movement through said threaded holes, and the engagement of said retaining cup key with said mounting block keyway preventing relative rotation of said cup and said mounting block by said rod threading movement.

3. In an electrical condenser assembly including a condenser plate having a threaded rod extending substantially perpendicularly from one face thereof, a supporting structure therefor comprising, a mounting block having a threaded hole for engagement with one portion of said threaded rod and also having a recess formed in one end thereof surrounding said threaded hole, said mounting block additionally being provided with a notched keyway in said one end at the outer edge of said recess, a retaining cup having a threaded hole for engagement with another portion of said threaded rod and also having a key projecting from the lip thereof for engagement of said mounting block keyway, and a helical compression spring surrounding said threaded rod and retained in a compressed state by said cup and the recessed portion of said mounting block, said spring tending to separate said retaining cup and said mounting block but being prevented therefrom by the engagement of said threaded rod with the respective threaded holes in said mounting block and said retaining cup, said rod being adapted for threading movement through said threaded holes, and the engagement of said retaining cup key with said mounting block keyway preventing relative rotation of said cup and said mounting block by said rod threading movement.

WILLIAM T. BROWN.
LA MAR C. GIRARDOT.

REFERENCES CITED

The following references are of record in the file of this patent:

UNITED STATES PATENTS

| Number | Name | Date |
|---|---|---|
| 525,780 | Boynton | Sept. 11, 1894 |
| 596,232 | Schmitt | Dec. 28, 1897 |
| 1,369,346 | Mazzocco | Feb. 22, 1921 |
| 1,612,414 | Brumder | Dec. 28, 1926 |
| 1,625,234 | Wittgenstein | Apr. 19, 1927 |
| 2,086,331 | Holmes | July 6, 1937 |
| 2,095,980 | Hansell | Oct. 19, 1937 |
| 2,106,120 | Lindberg | Jan. 18, 1938 |
| 2,253,849 | Dow | Aug. 26, 1941 |
| 2,391,917 | Newkirk | Jan. 1, 1946 |

OTHER REFERENCES

Product Engineering, pages 302–303, July 1939.